US008828846B2

(12) United States Patent
Ng

(10) Patent No.: US 8,828,846 B2
(45) Date of Patent: Sep. 9, 2014

(54) METHOD OF COMPUTING A WIDTH OF A SCRIBE REGION BASED ON A BONDING STRUCTURE THAT EXTENDS INTO THE SCRIBE REIGON IN A WAFER-LEVEL CHIP SCALE (WLCSP) PACKAGING

(75) Inventor: Philip S. Ng, Cupertino, CA (US)

(73) Assignee: Atmel Corporation, San Jose, CA (US)

(*) Notice: Subject to any disclaimer, the term of this patent is extended or adjusted under 35 U.S.C. 154(b) by 13 days.

(21) Appl. No.: 13/191,349

(22) Filed: Jul. 26, 2011

(65) Prior Publication Data

US 2013/0026605 A1    Jan. 31, 2013

(51) Int. Cl.
*H01L 21/00* (2006.01)
*H01L 23/31* (2006.01)
*H01L 21/56* (2006.01)
*H01L 23/00* (2006.01)

(52) U.S. Cl.
CPC .......... *H01L 21/561* (2013.01); *H01L 23/3114* (2013.01); *H01L 2224/131* (2013.01); *H01L 24/13* (2013.01); *H01L 2224/94* (2013.01)
USPC .................... 438/462; 438/113; 257/E21.523

(58) Field of Classification Search
USPC ........... 257/620, 524, E21.523; 438/113, 462
See application file for complete search history.

(56) References Cited

U.S. PATENT DOCUMENTS

| | | | | |
|---|---|---|---|---|
| 2002/0109133 | A1* | 8/2002 | Hikita et al. | 257/10 |
| 2002/0127777 | A1* | 9/2002 | Hikita et al. | 438/113 |
| 2003/0030138 | A1* | 2/2003 | Kim | 257/701 |
| 2003/0032263 | A1* | 2/2003 | Nagao et al. | 438/462 |
| 2010/0237494 | A1* | 9/2010 | Kweon et al. | 257/692 |
| 2011/0079892 | A1* | 4/2011 | Tsai et al. | 257/700 |
| 2011/0121449 | A1* | 5/2011 | Lin et al. | 257/737 |
| 2011/0127631 | A1* | 6/2011 | Kawashima | 257/466 |
| 2011/0221041 | A1* | 9/2011 | Lin et al. | 257/620 |
| 2012/0034760 | A1* | 2/2012 | Schuderer et al. | 438/462 |

* cited by examiner

*Primary Examiner* — William F Kraig
*Assistant Examiner* — Khaja Ahmad
(74) *Attorney, Agent, or Firm* — Fish & Richardson P.C.

(57) ABSTRACT

The disclosed WLCSP solution overcomes the limitations of fan-out WLCSP solutions, and other conventional solutions for WLCSP for small, high volume die, by increasing the width of scribe regions between die on a semiconductor substrate to accommodate bonding structures (e.g., solder balls) that partially extend beyond peripheral edges of the die. The scribe regions can be widened in x and y directions on the wafer. The widened scribe regions can be incorporated into the design of the mask set.

7 Claims, 3 Drawing Sheets

METHOD OF COMPUTING A WIDTH OF A SCRIBE REGION BASED ON A BONDING STRUCTURE THAT EXTENDS INTO THE SCRIBE REIGON IN A WAFER-LEVEL CHIP SCALE (WLCSP) PACKAGING

TECHNICAL FIELD

This disclosure relates generally to semiconductor packaging, and more particularly to wafer-level chip scale (WLCSP) packaging for small, high volume die.

BACKGROUND

WLCSP refers to the technology of packaging an integrated circuit at wafer level, instead of the traditional process of assembling the package of each individual unit after wafer dicing. Conventional WLCSP technology extends wafer fab processes to include device interconnection and device protection processes.

A conventional method to implement WLCSP technology for small die requires that the die on a primary wafer be scribed and separated from the wafer. The die are then placed further apart on a secondary wafer so solder balls used to connect the die to a printed circuit board (PCB) will have enough space without affecting the next die. When the die are cut from the primary wafer and placed in the secondary wafer, the die need to be aligned perfectly or the results will be compromised. A separate process distributes the original bond pads to the now spaced-out ball pads. The use of the secondary wafer and the corresponding additional process steps results in a time-consuming and expensive WLCSP solution.

Another conventional method to implement WLCSP is to re-layout the die to a bigger size to accommodate the bigger pitch of the target balls. This method is also time-consuming and expensive because another die must be created with a different layout, which requires additional design time. Additionally, product and quality control personnel need to characterize and test the new design to ensure it operates within the design specifications. Customers may need to re-qualify the new die if they were using the original die.

SUMMARY

The disclosed WLCSP solution overcomes the limitations of fan-out WLCSP solutions, and other conventional solutions for WLCSP for small, high volume die, by increasing the width of scribe regions between die on a semiconductor substrate to accommodate bonding structures (e.g., solder balls) that extend beyond peripheral edges of the die. The scribe regions can be widened in x and y directions on the wafer. The widened scribe regions can be incorporated into the design of the mask set.

Particular implementations of WLCSP provide advantages over conventional solutions, including but not limited to: 1) a reduction in the cost and time to make small WLCSP die; 2) the die layout does not have to be redesigned; 3) product and quality engineering time for WLCSP die evaluation is not increased; 4) customers do not need to re-qualify a new die layout; 5) single die probing can use the same hardware (probe card) since the die and pad locations have not changed; 6) time to market is reduced since the additional and time-consuming steps of scribing, sawing and placement of die on a secondary wafer are not performed; and 7) any changes in the original primary design database will have the same change for WLCSP die.

The details of one or more disclosed implementations are set forth in the accompanying drawings and the description below. Other features, aspects, and advantages will become apparent from the description, the drawings and the claims.

DETAILED DESCRIPTION

Figure 1:
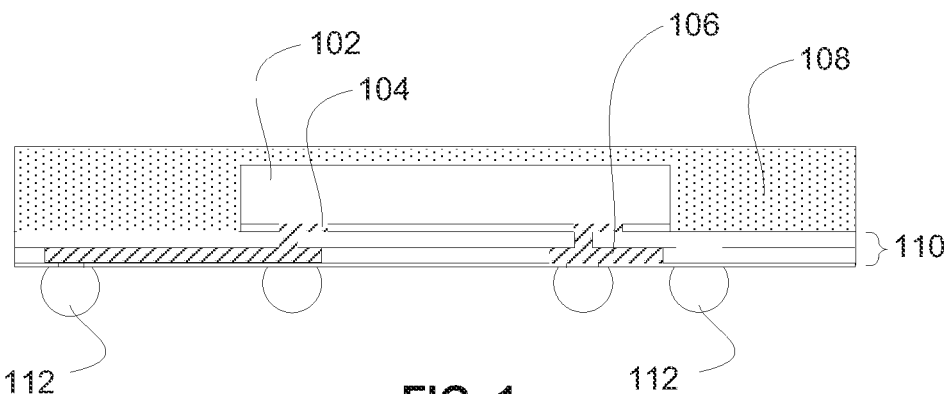
FIG. 1 is a schematic, cross-sectional view of a conventional fan-out WLCSP.

FIG. 1 is a schematic, cross-sectional view of a conventional fan-out WLCSP 100. In some implementations, fan-out WLCSP 100 comprises a semiconductor die 102 and a mold cap 108 encapsulating a portion of semiconductor die 102. Rewiring laminate structure 110 is provided directly on the front surface of semiconductor die 102 and on a partial surface of mold cap 108. A re-routed metal layer in rewiring laminate structure 110 redistributes contact pads 104 on the front surface (circuitry side) of semiconductor die 102 to form fan-out bond pads 106 on an insulating layer. Thereafter, solder balls 112 can be attached to the fan-out bond pads 106. Fan-out WLCSP 100 can then be directly mounted onto a PCB using a flip-chip technique. The use of rewiring laminate structure 110 in fan-out WLCSP 100 for solder ball redistribution requires additional time-consuming and expensive process steps that may require multi-layer thin-film metal rerouting to each die on the wafer using photolithography and thin film deposition techniques.

Figure 2A:
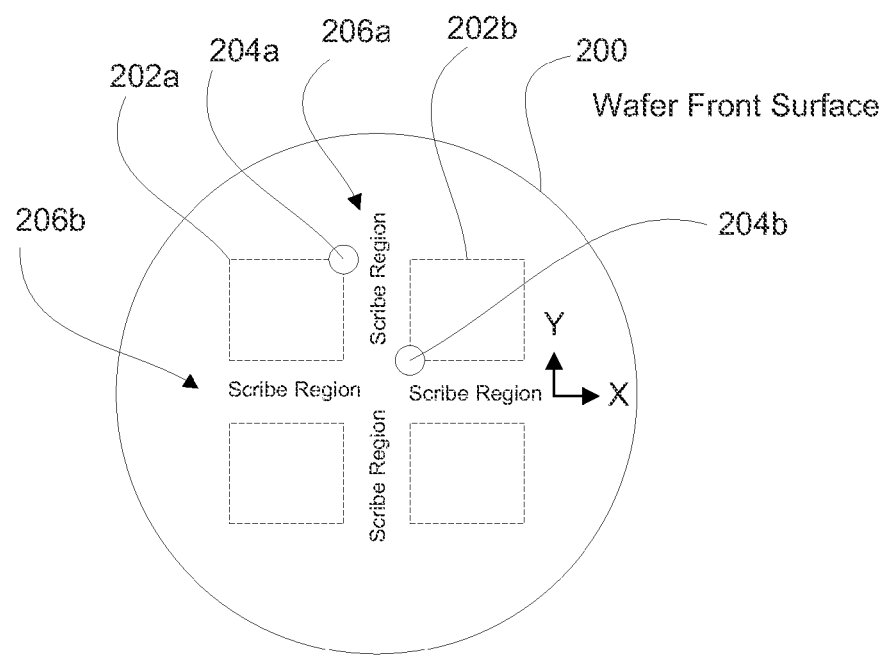
FIG. 2A is a schematic, top plan view of an exemplary wafer front surface, including widened scribe regions to accommodate bonding structures that extend beyond peripheral edges of die.

FIG. 2A is a schematic, top plan view of an exemplary wafer front surface, including widened scribe regions 206 to accommodate bonding structures 204 that extend beyond peripheral edges of die 202. Scribe regions 206 (also referred to as "saw streets" or "scribe lanes") include "x" scribe regions 206b and "y" scribe regions 206a, where "x" and "y" refer to horizontal and vertical directions on the front surface of wafer 200. For discussion purposes, only a quad of die and two solder balls are shown in FIG. 2. In practice, wafer 200 would have many more die distributed on front surface of wafer 200, and each die would be connected to several solder balls or bumps (e.g., 8 solder balls).

In some implementations, widened scribe regions 206 can be widened based on the anticipated pitch of the solder balls (e.g., 400 µm). For example, scribe regions 206 can be widened in the mask set to accommodate portions of solder balls 204 that extend partially beyond the peripheral edges of die 202, plus some additional space to allow for sawing between solder balls 204 without damaging solder balls 204 or die 202. In some implementations, scribe regions 206 can be D+n µm wide where D is the diameter of the solder balls (e.g., 230 µm) and n is an additional distance that is sufficient to accommodate a saw blade (e.g., 100 µm) so that balls or die are not damaged during sawing. In some implementations, the width of scribe regions 206 are extended beyond a standard width by a given process, which is limited by a width of a saw blade that is used to separate the die during a sawing process to accommodate the balls that extend beyond the die.

Solder balls 204 can be placed directly (without redistribution metal or wires) on contact pads (not shown) of dies 202, allowing the widened scribe regions 206 to accommodate the portions of solder balls 204 that extend partially beyond the peripheral edges of die 202. Thus, there is no need for rewiring laminate structure 110 as used in the conventional fan-out WLCSP 100 or the corresponding additional process steps, such as multi-layer thin-film metal rerouting to each die 202 on wafer 200.

Figure 2B:
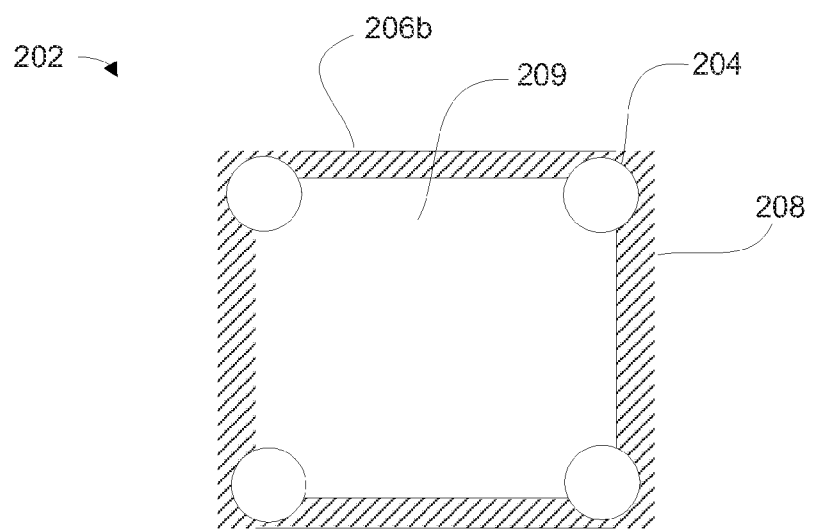
FIG. 2B is a schematic, top plan view of an exemplary die cut from the wafer of FIG. 2A.

FIG. 2B is a schematic, top plan view of an exemplary die 202 cut from wafer 200 of FIG. 2A. After sawing (also referred to as "dicing" or "singulation"), the singulated die 202 includes an integrated circuit region 209 and extended region 208. Integrated circuit region 209 includes the integrated circuit and contact pads (see FIG. 2C) for attaching bonding structures 204 to die 202. Extended region 208 is a portion of the pre-singulated, widened scribe region 206 that remains after sawing and at least partially surrounds integrated circuit region 209, as shown in FIG. 2B.

Figure 2C:
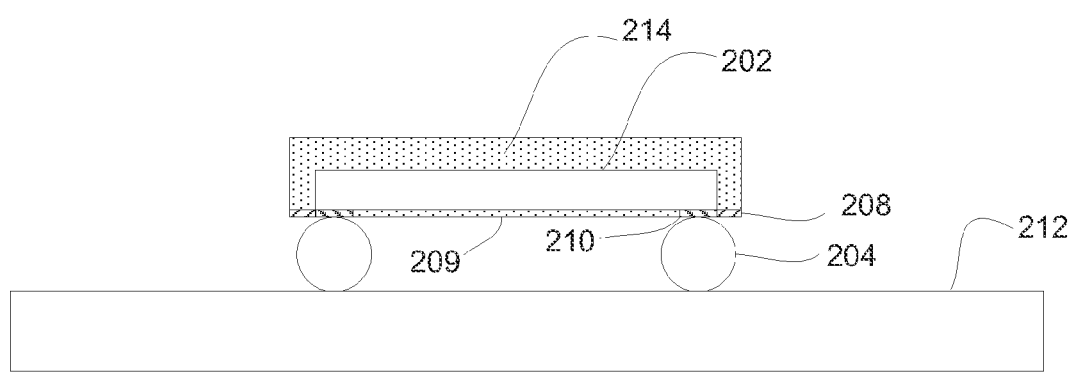
FIG. 2C is a schematic, cross-sectional view of a WLCSP fabricated according the techniques described in reference to FIGS. 2A and 2B and flip-chip bonded to a PCB.

FIG. 2C is a schematic, cross-sectional view of a WLCSP fabricated according the techniques described in reference to FIGS. 2A and 2B and flip-chip bonded to PCB 212. In the example shown, die 202 is partially encapsulated by mold cap 214. Contact pads 210 on the front surface of die 202 are coupled to bonding structures 204 (e.g., solder balls or bumps). Note that portions of the bonding structures 204 extend partially, laterally beyond the peripheral edges of integrated circuit region 209 and into extended region 208, as shown in FIG. 2C.

Figure 3:
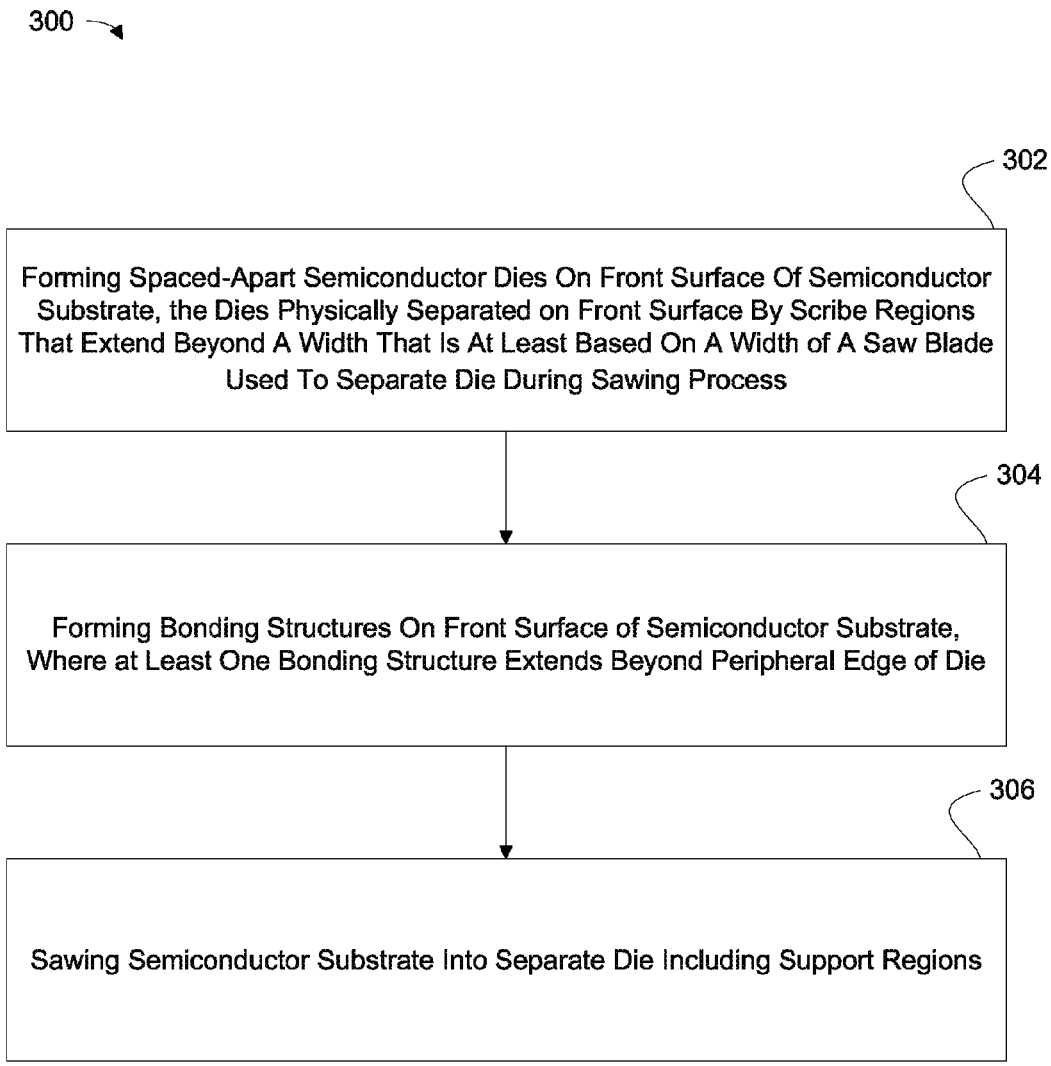
FIG. 3 is a flow diagram of an exemplary process for manufacturing a WLCSP having a support region.

FIG. 3 is a flow diagram a WLCSP fabrication process 300 with widened scribe regions as shown in FIG. 2A. In some implementations a WLCSP can be fabricated using a single semiconductor substrate (e.g., wafer 200), such that portions of bonding structures 204 partially extend beyond integrated circuit region 209 and into widened script regions 206 due to the small size of die 202 relative to bonding structures 204. Widened script regions 206 can be incorporated into the design of the mask set and applied to wafer 200 using known WLCSP processes and techniques.

In some implementations, process 300 can begin by forming spaced-apart semiconductor die on the front surface of a semiconductor substrate (e.g., a wafer). Semiconductor die separated from each other on the semiconductor substrate by scribe regions that extend beyond a width that is at least based on a width of a saw blade that is used to separate the die during a sawing process (302). For each die, process 300 can continue by forming bonding structures on the front surface of the semiconductor substrate and electrically coupling the bonding structures to the die using, for example, metal contact pads. For each die, bonding structures can partially extend beyond the peripheral edges of the die and into a widened scribe region (304).

The semiconductor substrate can be sawed along the middle of each widened scribe region to separate the die, such that each die maintains an extended region surrounding an integrated circuit region (306), as shown in FIGS. 2B and 2C. The individual die can be connected to a printed circuit board using flip-chip techniques. The printed circuit board can be installed into any desired electronic device.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method comprising:
   computing a diameter of a bonding structure operable to be electrically coupled to a semiconductor die formed on a semiconductor substrate;
   based on computing the diameter of the bonding structure, determining a dimension of a portion of the bonding structure that extends beyond a peripheral edge of the semiconductor die and into a scribe region, wherein the scribe region is incorporated into a mask set and includes an area extending in horizontal and vertical directions on a front surface of the semiconductor substrate between semiconductor dies, and wherein the semiconductor substrate is operable to be sawed along the scribe region to separate the semiconductor dies;
   computing a width of the scribe region based on the dimension of the portion of the bonding structure that extends into the scribe region, and an additional distance that is operable to accommodate a width of a saw blade used to separate at least one semiconductor die from other semiconductor dies during a sawing process, wherein the semiconductor dies are physically separated on the front surface of the semiconductor substrate by the scribe region that is configured with the computed width; and
   forming one or more bonding structures on the front surface of the semiconductor substrate where at least one bonding structure is electrically coupled to the semiconductor die and partially extends beyond the peripheral edge of the semiconductor die and into the scribe region.

2. The method of claim 1, where the at least one bonding structure includes a ball.

3. The method of claim 2, where the ball includes a solder ball.

4. The method of claim 1, where the semiconductor substrate includes a semiconductor wafer.

5. The method of claim 4, comprising:
   sawing the semiconductor die from the semiconductor wafer along the scribe region such that the semiconductor die includes an extended region surrounding an integrated circuit region, wherein the extended region corresponds to a portion of the scribe region into which the at least one bonding structure extends; and
   connecting the semiconductor die to a printed circuit board.

6. The method of claim 5, comprising:
   installing the printed circuit board into an electronic device.

7. The method of claim 3, where the width of the scribe region is configured based on an anticipated pitch of the solder ball.

* * * * *

UNITED STATES PATENT AND TRADEMARK OFFICE
CERTIFICATE OF CORRECTION

PATENT NO. : 8,828,846 B2  
APPLICATION NO. : 13/191349  
DATED : September 9, 2014  
INVENTOR(S) : Philip S. Ng Page 1 of 1

It is certified that error appears in the above-identified patent and that said Letters Patent is hereby corrected as shown below:

On the Title Page, Item (54) and in the Specification, Column 1, Line 4, (Title), Delete "REIGON" and insert --REGION--, therefor.

Signed and Sealed this
Sixteenth Day of December, 2014

Michelle K. Lee
*Deputy Director of the United States Patent and Trademark Office*